US007145775B2

(12) United States Patent
Barsun et al.

(10) Patent No.: US 7,145,775 B2
(45) Date of Patent: Dec. 5, 2006

(54) CHASSIS CONDUCTED COOLING THERMAL DISSIPATION APPARATUS FOR SERVERS

(75) Inventors: Stephan Karl Barsun, Davis, CA (US); Andrew Harvey Barr, Roseville, CA (US); Robert William Dobbs, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/903,000

(22) Filed: Jul. 30, 2004

(65) Prior Publication Data

US 2005/0013117 A1 Jan. 20, 2005

Related U.S. Application Data

(63) Continuation of application No. 10/434,762, filed on May 8, 2003, now Pat. No. 6,798,661.

(51) Int. Cl.
*H05K 7/20* (2006.01)

(52) U.S. Cl. ............... 361/719; 361/700; 361/704; 361/707; 257/715; 174/15.2; 174/16.1; 174/16.3; 165/80.3; 165/80.4; 165/104.26

(58) Field of Classification Search .......... 361/690, 361/695, 699, 700, 703, 704, 719–721, 688; 257/714, 715, 718, 727; 174/15.1–15.2, 174/16.1, 16.3; 165/80.3, 80.4, 104.26
See application file for complete search history.

(56) References Cited

U.S. PATENT DOCUMENTS

| | | | |
|---|---|---|---|
| 5,754,401 A * | 5/1998 | Saneinejad et al. ......... 361/705 |
| 5,910,884 A | 6/1999 | Garza et al. |
| 6,044,899 A * | 4/2000 | Langley et al. ......... 165/104.33 |
| 6,101,095 A * | 8/2000 | Yamaguchi ................. 361/720 |
| 6,185,101 B1 | 2/2001 | Itabashi et al. |
| 6,434,006 B1 * | 8/2002 | Fukatsu et al. ............. 361/704 |
| 6,442,025 B1 | 8/2002 | Nakamura et al. |
| 6,462,951 B1 | 10/2002 | Letourneau |
| 6,542,359 B1 | 4/2003 | Babcock et al. |
| 6,603,659 B1 * | 8/2003 | Kim et al. .................. 361/690 |
| 6,728,104 B1 * | 4/2004 | Ahmad et al. .............. 361/704 |
| 6,882,536 B1 * | 4/2005 | Deeney et al. .............. 361/719 |
| 6,914,780 B1 * | 7/2005 | Shanker et al. ............. 361/687 |
| 2003/0210524 A1* | 11/2003 | Berg et al. .................. 361/687 |

* cited by examiner

*Primary Examiner*—Boris Chervinsky (57) ABSTRACT

A thermal dissipation apparatus for implementing chassis conducted cooling for a server. The apparatus includes a heat sink having a first surface and a second surface. The first surface is adapted to accept a chip thermal interface for a chip. The second surface is adapted to accept a chassis thermal interface for a chassis surface, wherein the second surface implements a thermal conductive path from the chip to the chassis surface.

18 Claims, 5 Drawing Sheets

TOP VIEW

```
FAN

510
```

```
THERMAL DISSIPATION
APPARATUS

CHASSIS CONDUCTED COOLING THERMAL DISSIPATION APPARATUS FOR SERVERS

This patent application is a Continuation of commonly-owned patent application Ser. No. 10/434,762, filed on May 8, 2003, now U.S. Pat. No. 6,798,661, entitled "A CHASSIS CONDUCTED COOLING THERMAL DISSIPATION APPARATUS FOR SERVERS", by BARSUN et al., which is incorporated herein by reference.

TECHNICAL FIELD

The present invention pertains to the field of digital computer systems. More particularly, the present invention relates to thermal management in the operational of thin servers.

BACKGROUND ART

Digital computers are being used today to perform a wide variety of tasks. Many different areas of business, industry, government, education, entertainment, and most recently, the home, are tapping into the enormous and rapidly growing list of applications developed for today's increasingly powerful computer devices. The widespread deployment of computer systems has led to the equally widespread deployment of interconnected networks of digital computer systems (e.g., LANs, WANs, Intranets, the Internet, etc.). The infrastructure of network connected digital computer systems has led to the ubiquitous adoption of network based applications, Web applications, Web based services, and the like. Many types of these network-based applications rely upon network-connected servers for their functionality.

With the increasing use of network based applications, there is interest in increasing the performance of these applications while simultaneously decreasing cost of the hardware infrastructure required to support these applications. Specifically, thin servers are being widely adopted as a means of providing Web/network based services cost effectively.

Generally, the term "thin server" refers to a network-based computer specialized for some particular function such as, for example, a print server, DSL router, or network attached storage (NAS). Thin servers are particularly designed for ease of installation. Thin servers generally have very little expandability and are deployed without a keyboard or monitor. Web server software is typically built in allowing management and control via a Web browser residing on a client platform in the network.

The thin server term has also come to refer to the size of such network based computers. Thin servers are typically designed to be rack mounted. As thin servers have become more specialized and more developed, development effort has been expended in making the servers consume as little space as possible within a server rack. Contemporary thin servers can be stacked on top of each other and take up considerably less space than, for example, tower cases.

To improve performance, the industry trend for computer servers is to put higher power (e.g., higher performance) chips in smaller server chassis. Thus, a larger number of servers (e.g., thin servers) can be deployed within the available space of a given server rack. As the server chassis become increasingly thin (e.g. smaller), a direct product of this trend is that less height within the chassis is available for heat sinks of high-powered chips. This problem is expressly evident in thin servers such as 1 U high servers where only 1.75 inches of height is available for the entire system chassis.

Figure 1:
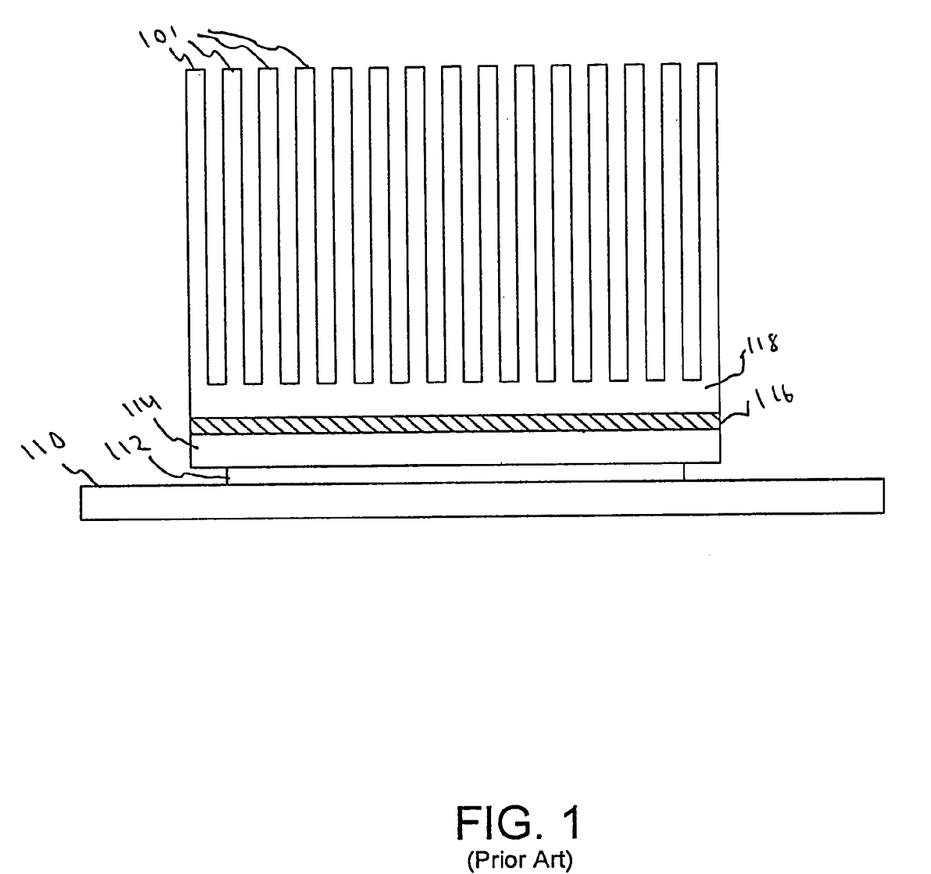
FIG. 1 shows a vertical cross section of a traditional prior art heat sink where the ability of the heat sink to cool is a function of the surface area of the heat sink fins.

Prior art FIG. 1 shows a vertical cross section of a traditional prior art heat sink where the ability of the heat sink to cool is a function of the surface area of the heat sink fins (among other factors). As depicted in FIG. 1, the heat sink comprises the heat sink base 118 and the heat sink fins 101. The heat sink fins 101 are coupled to the base of the heat sink 118. A thermal interface 116 connects the base 118 to a chip lid 114 (e.g., the upper surface of the chip). An interconnect 112 electrically couples the chip to a printed circuit board 110 within the server. As can be seen in FIG. 1, the height of the fins 101 of the heat sink is limited in a thin server. The fins 101 must dissipate the majority of the heat dissipated by the chip. As can be seen in FIG. 1, the smaller the chassis of the server, the less available surface area for heat dissipation is provided by the fins 101. This can have extremely harmful effects on the longevity and the performance of high-powered chips.

Prior art solutions to this problem have not been satisfactory. One prior art solution involves making a wider heat sink in order to allow more fins and thus more surface area for cooling. A disadvantage with this solution is that the thermal resistance increases for the fins that are farther away from the heat source. Thus diminishing returns are realized for the added fins towards the outer edges of the width-expanded heat sink. Another disadvantage of the solution is that the wider heat sink consumes more PCB area that could otherwise be used for other components.

Another prior art solution involves using more expensive materials (i.e. higher thermal conductivity copper instead of aluminum) for the heat sink, or using heat pipes or vapor chambers in a conventional heat sink configuration, to increase cooling efficiency and to provide a somewhat higher degree of cooling with less fin area. A disadvantage with this solution is that it increases costs, and there are limits to the effectiveness of these methods.

Yet another prior art solution involves simply using lower power, lower performance processors and chips. Obviously, the disadvantage in this solution is the fact that the performance of the thin server, or any type of server for that matter, is adversely impacted.

Thus what is required is a solution that efficiently implements cooling for servers. What is required is a solution that efficiently manages thermal energy generated by the use of high performance, high-powered processors and chips. The required solution should efficiently dissipate thermal energy within the constraints of a thin server chassis. The present invention provides a novel solution to the above requirements.

DISCLOSURE OF THE INVENTION

A thermal dissipation apparatus for implementing chassis conducted cooling for a server is disclosed. In one embodiment, the apparatus includes a heat sink having a first surface and a second surface. The first surface is adapted to accept a chip thermal interface for a chip. The second surface is adapted to accept a chassis thermal interface for a chassis surface. The second surface implements a thermal conductive path from the chip to the chassis surface.

BRIEF DESCRIPTION OF THE DRAWINGS

The accompanying drawings, which are incorporated in and form a part of this specification, illustrate embodiments of the invention and, together with the description, serve to explain the principles of the invention.

Prior art

BEST MODES FOR CARRYING OUT THE INVENTION

Embodiments of the present invention are directed towards a chassis conducted cooling thermal dissipation apparatus for servers. In one embodiment, the apparatus includes a heat sink having a first surface and a second surface. The first surface is adapted to accept a chip thermal interface for an integrated circuit chip. The second surface is adapted to accept a chassis thermal interface for a chassis surface, wherein the second surface implements a thermal conductive path from the chip to the chassis surface. The thermal conductive path from the chip to the chassis surface provides an additional mechanism by which heat is conducted away from the chip. Heat is conducted away from the chip through the PCB (printed circuit board) on which the chip is mounted. Additionally, heat is conducted away from the chip, through the heat sink, and into the chassis surface and the material of the chassis. In this manner, embodiments of the present invention utilize the mass of the chassis itself to sink heat away from the chip. By implementing a thermal conductive path into the chassis, embodiments of the present invention dissipate thermal energy generated by the chip without requiring overly exotic, or overly expensive, heat sink implementations. By using the mass of the chassis itself to sink heat away from the chip, embodiments of the present invention provide effective thermal dissipation for high-performance, high-power chips within the confined spaces of, for example, a thin server.

Figure 2:
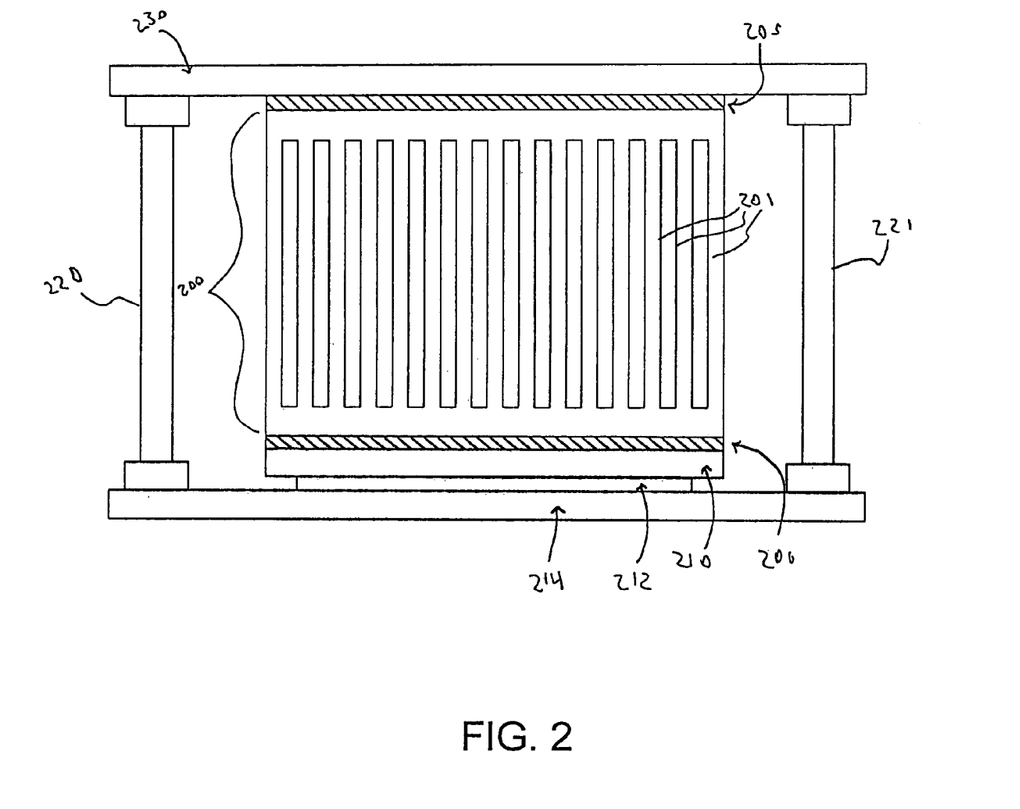
FIG. 2 shows a diagram of a heat sink thermal dissipation apparatus in accordance with one embodiment of the present invention.

FIG. 2 shows a diagram of a thermal dissipation apparatus in accordance with one embodiment of the present invention. As depicted in FIG. 2, the apparatus includes a heat sink 200. The heat sink 200 includes a plurality of thermally conductive fins 201, or simply cooling fins 201. As shown in FIG. 2, the heat sink 200 includes a first surface, in this case the lower surface, adapted to couple to the upper surface of an integrated circuit chip 210 (e.g., the chip lid). A thermal interface 206 couples the lower surface of the heat sink 200 to the chip lid of integrated circuit chip 210. The integrated circuit chip 210 connects to a printed circuit board 214 through a chip interconnect 212.

The heat sink 200 includes a second surface, in this case the upper surface, adapted to couple to the lower surface of the chassis 230 of a server. A thermal interface 205 couples the upper surface of the heat sink 200 to the lower surface of the chassis 230. First and second support members 220 and 221 are shown. The support members 220 and 221 implement a support structure that functions by limiting any compression force that may be transmitted to chip 210 through the heat sink 220 (e.g., any pressure on the upper surface of the chassis 230).

Figure 5:
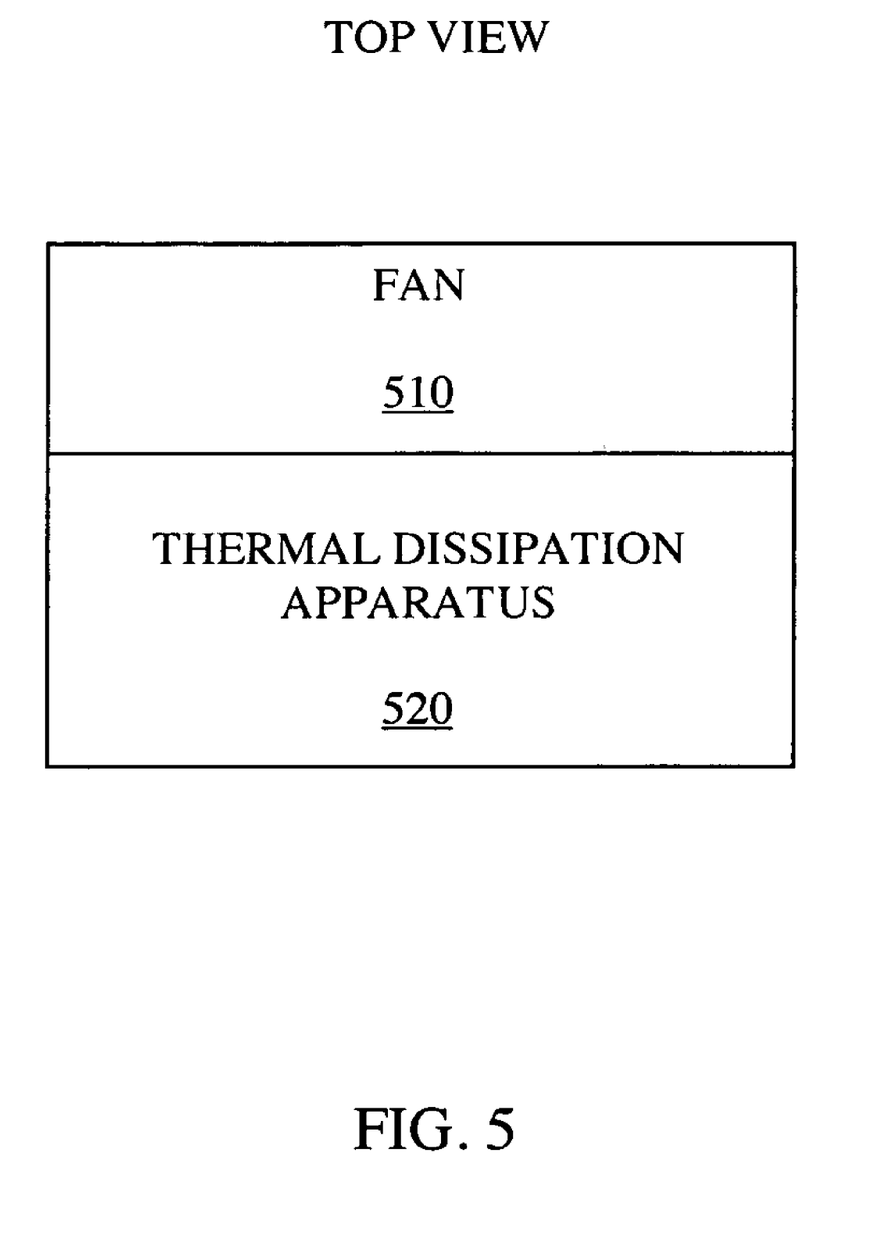
FIG. 5 shows a top view of a fan coupled to a thermal dissipation apparatus in accordance with one embodiment of the present invention.

Thus, in the embodiment shown in FIG. 2, three distinct thermal conductive paths are provided for the chip 210. The first thermal conductive path is from the chip 210 through the interconnect 212 into the printed circuit board 214 (e.g., heat flowing out the bottom of the chip 210). The second thermal conductive path is from the chip 210 through the body of the heat sink 200 and into the chassis 230. The third thermal conductive path is through the cooling fins 201 into the forced air stream (e.g., from a cooling fan) flowing within the chassis. In one embodiment, a fan can be added (e.g., mounted on the heat sink 200) to increase the amount of air flowing over the surface of the cooling fins 201. FIG. 5 shows a top view of a fan 510 coupled to a thermal dissipation apparatus 520 (e.g., heat sink 200) in accordance with one embodiment of the present invention.

In this manner, embodiments of the present invention provide a thermal conductive path from the chip 210 to the lower surface of the chassis 230 and into the material of the chassis 230 itself. The thermal conductive path into the chassis 230 provides an additional mechanism by which heat is conducted away from the chip 210, in comparison to prior art heat sink mechanisms. As some amount of heat is conducted away from the chip 210 through the PCB 214, an additional amount of heat is conducted away from the chip 210, through the heat sink 200, and into the material of the chassis 230. In so doing, embodiments of the present invention utilize the mass of the chassis 230 to sink heat away from the chip 210.

The heat sink 200 of the embodiment of FIG. 2 can be fabricated of conventional heat sink materials (e.g., aluminum). By implementing the thermal conductive path into the chassis 230, embodiments of the present invention dissipate thermal energy generated by the chip 210 without requiring overly exotic, or overly expensive, heat sink implementations, such as, for example, requiring copper for the fabrication of heat sink 200.

The use of the chassis 230 to sink heat from the heat sink 200 and the chip 210 provides thermal dissipation performance as if a very much larger heat sink was employed. The mass of the chassis 230 (e.g., made from steel or aluminum) provides a large reservoir to draw heat from the chip 210. This heat dissipation performance is provided without using a bulky heat sink that would take up space within the chassis 230 that could otherwise be used for additional components.

The added thermal dissipation performance provided by the thermal conductive path into the chassis 230 allows the use of high-performance, high-power chips within the confined spaces of, for example, a thin server. In accordance with embodiments of the present invention, the performance of a thin server need not be unnecessarily constrained by limited, prior art type, thermal dissipation mechanisms. High-performance, high-power chips can be used even though the thin server may be only IU high (e.g., 1.75 inches).

It should be noted that the base of the heat sink 200 could include a heat spreader between the chip 210 and the cooling fins 201. The cooling fins 201 extend vertically upwards from the base of the heat sink 100. At the top of the cooling fins 201 an additional heat spreader is included within the heat sink 200. The thermal interface 205 and the thermal interface 206 comprise thermally conductive material (e.g., thermal grease, silicone, etc.) that mates the surfaces of the heat sink 200 to the chassis 230 and the chip 210. In this manner, the entire top structure of the server chassis 230 is made to assist in transferring heat from the chip 210 into the environment.

Figure 3:
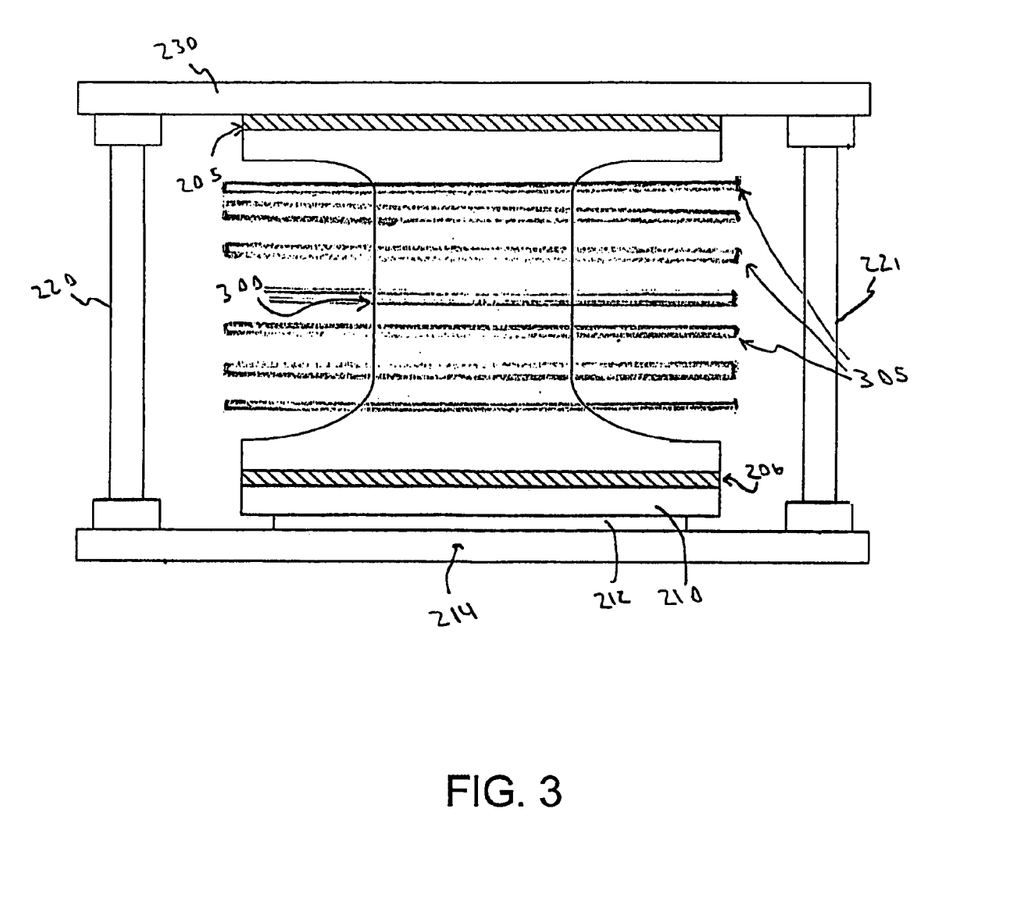
FIG. 3 shows a diagram of a heat pipe thermal dissipation apparatus in accordance with one embodiment of the present invention.

FIG. 3 shows a diagram of the heat pipe thermal dissipation apparatus in accordance with one embodiment of the present invention. As depicted in FIG. 3, the apparatus includes a heat pipe 300. The apparatus of FIG. 3 is substantially similar to the apparatus FIG. 2. Instead of a heat sink 200 providing the thermal conductive path from the chip 210 to the chassis 230, a heat pipe 300 provides thermal conductive path from the chip 210 to the chassis 230. Depending upon the requirements of the particular implementation, the heat pipe 300 may or may not include a plurality of cooling fins (e.g., similar to the fins 201 FIG. 2).

The embodiment shown in FIG. 3, in the same manner as the embodiment shown in FIG. 2, provides three distinct thermal conductive paths for the chip 210. The first thermal conductive path is from the chip 210 through the interconnect 212 into the printed circuit board 214. The second thermal conductive path is from the chip 210 through the body of the heat pipe 300 and into the chassis 230. The third thermal conductive path is from the cooling fins 305 into the forced air stream within the chassis. As with the FIG. 2 embodiment, a fan can be added (e.g., mounted on the heat pipe 300) to increase the amount of air flowing over the surface of the heat pipe 300 or the cooling fins 305 on the surface of heat pipe 300. FIG. 5 shows a top view of a fan 510 coupled to a thermal dissipation apparatus 520 (e.g., heat pipe 300) in accordance with one embodiment of the present invention.

The use of the heat pipe 300 in the FIG. 3 embodiment provides a more efficient thermally conductive path from the chip 210 to the chassis 230 in comparison to the heat sink 200 of the FIG. 2 embodiment. However, the incorporation of the heat pipe 300 makes the FIG. 3 embodiment somewhat more complex (e.g., and, perhaps somewhat more expensive) than the FIG. 2 embodiment.

Figure 4:
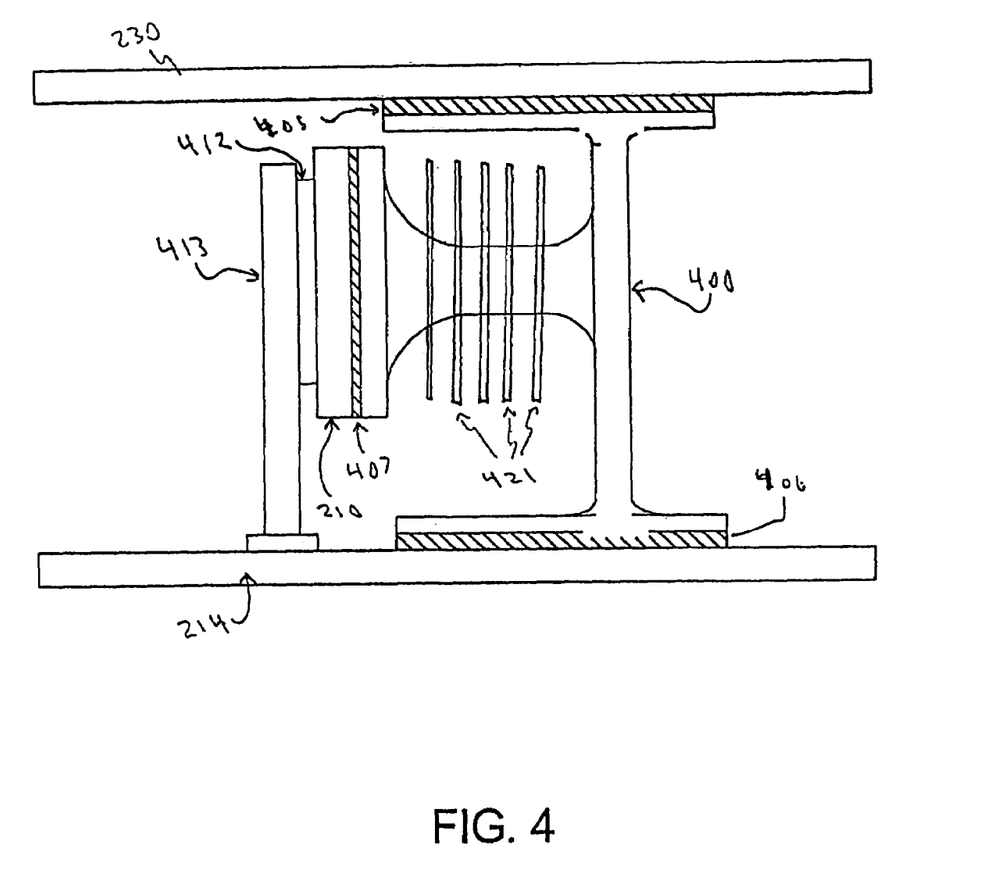
FIG. 4 shows a diagram of a heat pipe thermal dissipation apparatus in accordance with another embodiment of the present invention.

FIG. 4 shows a diagram of a heat pipe thermal dissipation apparatus in accordance with another embodiment of the present invention. As depicted in FIG. 4, a heat pipe 400 is provided having three heat conducting surfaces. The first and second heat conducting surfaces mount to the thermal interface 405 and thermal interface 406 respectively as shown. The third heat-conducting surface of the heat pipe 400 mounts to the chip 210 through a thermal interface 407. In this embodiment, the chip 210 mounts to a chip interface 412, which in turn mounts to a riser 413 that couples the chip 210 to the printed circuit board 214, as shown.

The heat pipe 400 of the FIG. 4 embodiment provides three distinct thermal conductive paths for the chip 210, in this case, through the interface 405 into the chassis 230 on the upper side, through the interface 406 into the printed circuit board 214 on the lower side, and through the cooling fins 421 into the air stream within the chassis. Some additional amount heat also flows from the chip 210 through the interconnect 412, the riser 413, and into the printed circuit board 214. As with the FIG. 2 and the FIG. 3 embodiments, a fan can be added (e.g., mounted on the heat pipe 400) to increase the amount of air flowing over the surface of the heat pipe 400 or the cooling fins 421. FIG. 5 shows a top view of a fan 510 coupled to a thermal dissipation apparatus 520 (e.g. heat pipe 400) in accordance with one embodiment of the present invention.

The heat pipe 400 embodiment provides an advantage in that support members (e.g., support members 220 and 221) do not need to be included. This is because the configuration of the heat pipe 400 avoids placing any compressive loads directly onto the chip 210. Thus, in this embodiment, the space that would be occupied by support members can be utilized for other components. In other respects, the heat pipe 400 embodiment is substantially similar to the heat pipe 300 embodiment of FIG. 3.

Thus, embodiments of the present invention, a chassis conducted cooling thermal dissipation apparatus for thin servers, have been described. The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order best to explain the principles of the invention and its practical application, thereby to enable others skilled in the art best to use the invention and various embodiments with various modifications as are suited to the particular use contemplated. It is intended that the scope of the invention be defined by the claims appended hereto and their equivalents.

What is claimed is:

1. A thermal dissipation apparatus for implementing chassis conducted cooling for a server, comprising a heat sink having a first surface, a second surface, and a plurality of thermally conductive fins, the first surface is in thermal contact with a chip thermal interface for a chip, the second surface is in thermal contact with a chassis thermal interface for a chassis surface, wherein said plurality of thermally conductive fins direct heat from said chip into surrounding air, and wherein said plurality of thermally conductive fins serve as a thermal conductive path to direct heat away from said chin into said chassis surface.

2. The apparatus of claim 1 wherein the heat sink includes a fan to flow cooling air across the thermally conductive fins.

3. The apparatus of claim 1 further comprising a support structure disposed around the heat sink to limit compression on the chip and the heat sink.

4. The apparatus of claim 1 wherein the chip thermal interface is adapted to couple the heat sink to a chip lid connected to the chip.

5. The apparatus of claim 1 wherein the heat sink is configured for a thin server chassis.

6. The apparatus of claim 1 wherein the thin server chassis is less than 1.75 inches in height.

7. A thermal dissipation heat pipe apparatus for implementing chassis conducted cooling for a server, comprising a thermally conductive heat pipe having a first surface, a second surface, and a plurality of thermally conductive fins, the first surface is in thermal contact with a chip thermal interface for a chip, the second surface is in thermal contact with a chassis thermal interface for a chassis surface, wherein said plurality of thermally conductive fins direct heat from said chip into surrounding air, and wherein said plurality of thermally conductive fins serve as a thermal conductive path to direct heat away from said chin into said chassis surface.

8. The apparatus of claim 7 wherein the heat pipe includes a fan to flow cooling air across the cooling fins.

9. The apparatus of claim 7 further comprising a support structure near the heat pipe to limit stress on the chip and the heat pipe.

10. The apparatus of claim 7 wherein the chip thermal interface is adapted to couple the heat pipe to a chip lid for the chip.

11. The apparatus of claim 7 wherein the heat pipe is configured for a thin server chassis.

12. The apparatus of claim 7 wherein the thin server chassis is less than 1.75 inches in height.

13. A thermal dissipation apparatus for implementing chassis conducted cooling for a computer system, comprising a heat sink means having a first surface, a second surface, and a plurality of thermally conductive fins, the first surface having means for interfacing with a chip, the second surface having means for interfacing with a chassis surface, wherein said plurality of thermally conductive fins direct heat from said chip into surrounding air, and wherein said plurality of thermally conductive fins serve as a thermal conductive path to direct heat away from said chip into said chassis surface.

14. The apparatus of claim 13 wherein the heat sink means includes a plurality of thermally conductive fins between the first surface and the second surface.

15. The apparatus of claim 14 wherein the heat sink means includes a fan to flow cooling air across the thermally conductive fins.

16. The apparatus of claim 13 further comprising a support means disposed around the heat sink means to limit compression on the chip and the heat sink means.

17. The apparatus of claim 13 wherein the heat sink means is configured for a thin server chassis.

18. The apparatus of claim 13 wherein the thin server chassis is less than 1.75 inches in height.

* * * * *

UNITED STATES PATENT AND TRADEMARK OFFICE
CERTIFICATE OF CORRECTION

PATENT NO. : 7,145,775 B2  Page 1 of 1
APPLICATION NO. : 10/903000
DATED : December 5, 2006
INVENTOR(S) : Stephan Karl Barsun et al.

It is certified that error appears in the above-identified patent and that said Letters Patent is hereby corrected as shown below:

In column 4, line 57, delete "IU" and insert -- 1U --, therefor.

In column 6, line 34, in Claim 1, delete "chin" and insert -- chip --, therefor.

In column 6, line 47, in Claim 6, delete "1 .75 inches" and insert -- 1.75 inches --, therefor.

In column 6, line 58, in Claim 7, delete "chin" and insert -- chip --, therefor.

In column 7, line 4, in Claim 12, delete "1 .75 inches" and insert -- 1.75 inches --, therefor.

Signed and Sealed this

Twenty-second Day of December, 2009

David J. Kappos
*Director of the United States Patent and Trademark Office*